(12) United States Patent  (10) Patent No.: US 8,270,849 B2
Kaneda et al.  (45) Date of Patent: Sep. 18, 2012

(54) PHASE ERROR CORRECTION IN A COHERENT RECEIVER

(75) Inventors: Noriaki Kaneda, Westfield, NJ (US); Andreas B. Leven, Heroldsberg (DE)

(73) Assignee: Alcatel Lucent, Paris (FR)

( * ) Notice: Subject to any disclaimer, the term of this patent is extended or adjusted under 35 U.S.C. 154(b) by 810 days.

(21) Appl. No.: 12/414,998

(22) Filed: Mar. 31, 2009

(65) Prior Publication Data

US 2010/0247113 A1  Sep. 30, 2010

(51) Int. Cl.
    *H04B 10/06* (2006.01)
(52) U.S. Cl. .................. 398/209; 398/204; 398/206
(58) Field of Classification Search .................. 398/238, 398/204, 207, 209, 213, 206
    See application file for complete search history.

(56) References Cited

U.S. PATENT DOCUMENTS

| 4,091,453 | A | 5/1978 | Martin |
| 4,489,392 | A | 12/1984 | Lewis |
| 5,949,821 | A | 9/1999 | Emami et al. |
| 6,009,317 | A | 12/1999 | Wynn |
| 6,044,112 | A | 3/2000 | Koslov |
| 6,122,325 | A | 9/2000 | Mogre et al. |
| 6,765,623 | B1 | 7/2004 | Parker |
| 6,847,693 | B1 * | 1/2005 | Strait ............................ 375/355 |
| 6,895,045 | B2 | 5/2005 | Ozluturk et al. |
| 6,917,031 | B1 | 7/2005 | Sun et al. |
| 7,061,994 | B2 | 6/2006 | Li et al. |
| 7,280,619 | B2 | 10/2007 | Nemer et al. |
| 7,298,222 | B2 | 11/2007 | Rosik et al. |
| 7,684,713 | B2 * | 3/2010 | Terayama et al. ............. 398/208 |
| 2004/0032954 | A1 * | 2/2004 | Bonfrate et al. ............. 380/263 |
| 2007/0297806 | A1 | 12/2007 | Kaneda et al. |

OTHER PUBLICATIONS

Yan Han and Guifang Li, "Coherent Optical Communication Using Polarization Multiple-Input-Multiple-Output," Optics Express, vol. 13, No. 19, Sep. 19, 2005, pp. 7527-7533.

* cited by examiner

*Primary Examiner* — Dawayne A Pinkney

(74) *Attorney, Agent, or Firm* — Wall & Tong, LLP

(57) ABSTRACT

A method and apparatus for correcting of phase errors in a coherent optical receiver are disclosed. Embodiments include a method for calculating a phase error between in-phase and quadrature-phase component signals, multiplying the phase error by one of the component signals and subtracting the result from the other component signal to output a corrected signal.

25 Claims, 8 Drawing Sheets

PHASE ERROR CORRECTION IN A COHERENT RECEIVER

FIELD OF THE INVENTION

The present invention relates to signal receivers and, more specifically, to correcting the phase error exhibited by a phase encoded signal.

BACKGROUND OF THE INVENTION

Polarization multiplexed receivers as well as optical hybrids have been described in detail in Kaneda, et al., "System and Method for Receiving Coherent, Polarization-Multiplexed Optical Signals," Patent Application Publication No. US 2007/0297806 A1, Dec. 27, 2007, which is incorporated herein by reference in its entirety. Due to imperfections in manufacturing, temperature effects and other impairments of the optical hybrid in particular, the phase difference between the in-phase (I) and quadrature (Q) components may deviate from the ideal 90 degree separation. Such a deviation is referred to as a phase error.

In many systems the phase error results in a significant transmission penalty characterized by a higher bit error rate (BER) and, in optical systems, higher required optical signal to noise ratio (OSNR) for a given BER.

Methods for correcting phase error have been implemented in a digital signal processor (DSP). Known techniques include estimating the phase error and applying a correction factor derived from the phase error to one or both of the in-phase and quadrature components of the input signal. However, such techniques have been complicated.

SUMMARY OF THE INVENTION

Various deficiencies of the prior art are addressed by the embodiments disclosed herein.

Embodiments of the present invention provide an improved and simplified means of correcting a phase error exhibited by a signal received by a coherent receiver that can be implemented with a minimum of circuitry and which can be executed with minimum processing delay. The phase error may be due to transmission penalties, by imperfections within the receiver itself, and any number of reasons which can all be corrected by way of embodiments of the present invention. In one embodiment the invention comprises a receiver system with an optical hybrid that includes an adjustable phase control mechanism that is controlled by a phase correction signal. In one embodiment, the invention includes an exclusive or-gate and an integrator for constructing a phase error signal. Another embodiment includes a multiplier and a low pass filter for correlating the in phase and quadrature components of an input signal to derive a phase error signal.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Embodiments of the invention enable efficient detection and correction of phase errors exhibited by an input signal in a coherent receiver. In particular, the embodiments provide a novel and simple algorithm for calculating and correcting a phase error.

For ease of reference, embodiments will be described in particular relation to an optical hybrid receiver. However, it is to be understood that the embodiments are not so limited in scope and in application. For example various types of phase encoded signals with in-phase and quadrature phase components may also exhibit deviations from the ideal 90 degree separation. Signals that may be affected by a phase error include radar signals, wireless telephone and data signals, satellite and cable television signals, fiber-optic communications signals and electrical data signals. Such signals may be encoded by phase shift keying (PSK), differential phase shift keying (DPSK) or quadrature phase shift keying (QPSK), for example, or may be any other type of phase modulated or quadrature amplitude modulated (QAM) signal. Phase error in such systems can arise from imperfect analog demodulation, variations in temperature, manufacturing tolerances, and other imbalances between components that may act upon the in-phase and quadrature channels for example.

One embodiment includes circuitry for detecting and correcting a phase error. In one embodiment, such circuitry is included within a digital signal processing block, but need not be. One embodiment includes error correction circuitry that provides a correction signal used to control the phase adjustment of an optical hybrid. Another embodiment is adapted for use in a parallel processor with multiple data paths.

Figure 1:
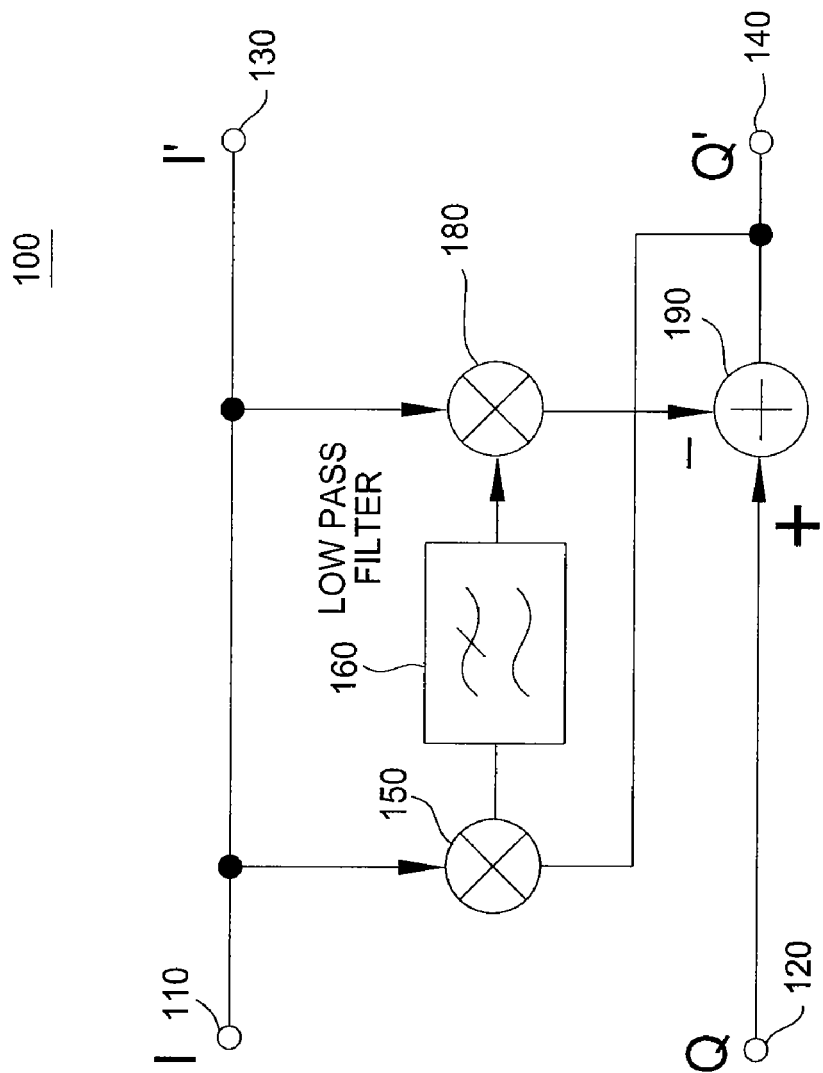
FIG. 1 depicts a correction circuit according to one embodiment of the present invention.

FIG. 1 depicts a block diagram of a correction circuit 100 for correcting phase error of a received signal. The correction circuit 100 is contained, illustratively, within a digital signal processing block of a receiver. The digital signal processing block follows analog to digital converters which sample and convert received analog signals to digital signals. In the case of an optical receiver, the digital signal processing block follows one or more photodiodes or similar devices for converting optical signals into electrical voltages in line with analog to digital converters.

The correction circuit 100 has two inputs. A first input 110 carries the in-phase component ("I") of a received phase encoded signal. A second input 120 carries the quadrature component ("Q") of a received phase encoded signal. Each tributary I and Q carries a digital signal output from an analog to digital converter which acts upon a received signal. The I signal and a corrected Q signal, Q' (which is explained in further detail below), are multiplied by the multiplier 150 to produce thereby an intermediate or resulting signal (i.e., a signal that will be processed further in accordance with the embodiments). The multiplier may comprise any device well known in the art suitable for such purpose. The result of the multiplication is then submitted to a low pass filter 160 to produce thereby a second intermediate/resulting signal. The combined effect of the multiplier 150 and low pass filter 160 is to output a time-averaged multiplication of the I and Q tributaries.

A time averaged multiplication is essentially the same as a correlation function. In an ideal system, the correlation of the I and Q signals should be zero on average. Thus, when a phase error is present, there result of the correlation function of I and Q will be non-zero and is dependent upon the sine of the phase error $\theta$. The circuit of FIG. 1 comprises a feedback system wherein the signal Q' is taken after correction (further described below) for feeding the correlation multiplier 150. In the steady state, $\theta$ is very small and therefore the approximation $\sin\theta \approx \theta$ is valid and may be appropriately used. In addition, a phase error will not change rapidly over time. Thus, ideally the low pass filter 160 will have a very low cut-off frequency to eliminate high frequency elements.

The output of the low pass filter 160 (the second intermediate/resulting signal) is then multiplied by the I signal by multiplier 180 and the result, which can be considered as a "correction factor," is subtracted from the Q signal by adder 190 to produce the corrected quadrature signal Q' which is output at 140 and which is also the feedback input to multiplier 150. The I signal is passed through unaltered to output 130 as I'.

Figure 2:
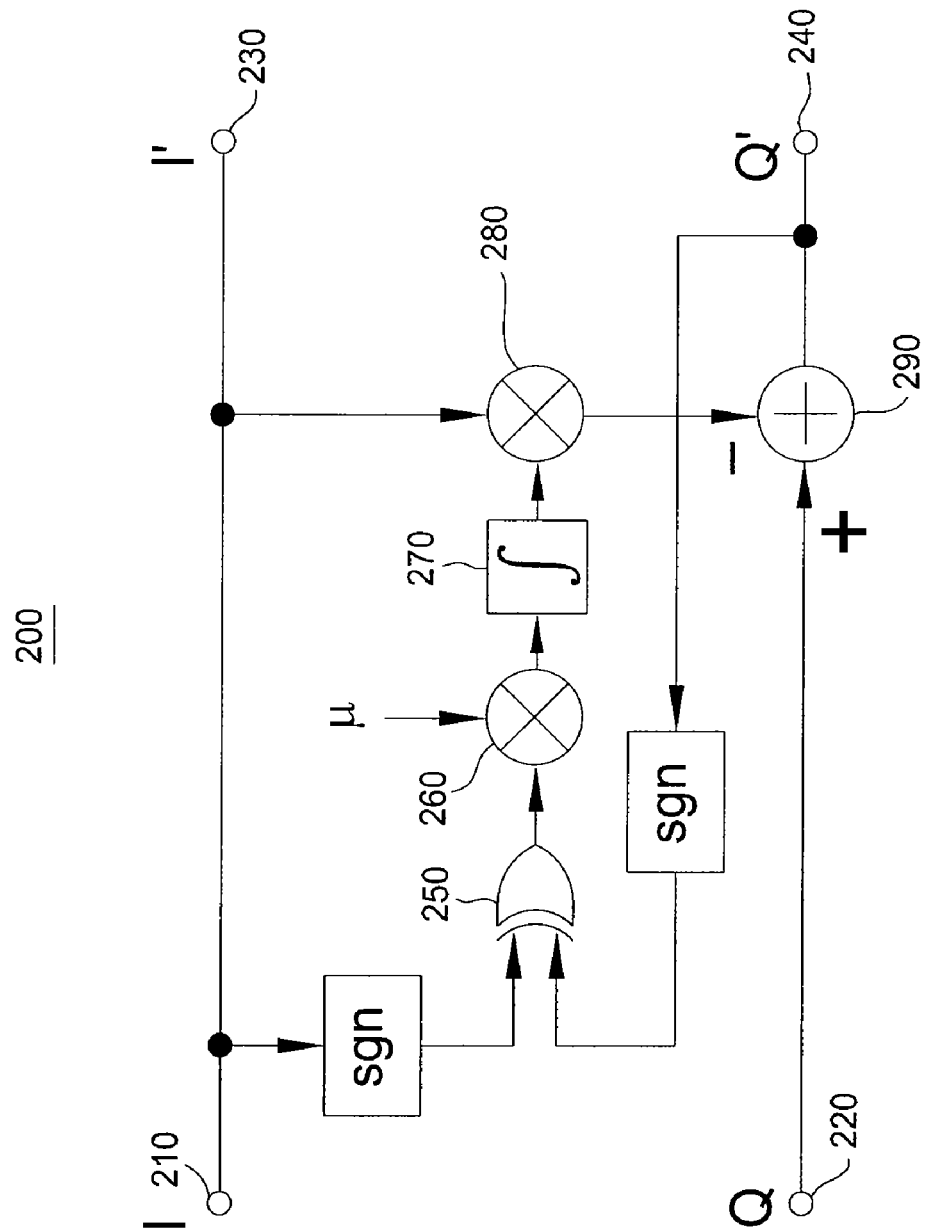
FIG. 2 depicts a correction circuit according to another embodiment of the present invention.

FIG. 2 depicts an alternative embodiment of a correction circuit 200 for correcting the phase error of a received signal. In the embodiment depicted in FIG. 2, the correction circuit 200 is contained within a digital signal processing block. The correction circuit 200 has two inputs. A first input 210 carries the in-phase component ("I") of a received signal. A second input 220 carries the quadrature component ("Q") of a received signal. Each tributary I and Q carries a digital signal that follows an analog to digital converter which acts upon a received signal. Only the sign values of the I signal and a corrected Q signal, Q' (which is explained in further detail below), are input into an exclusive-or gate (XOR) 250 for processing to produce thereby an intermediate or resulting signal (i.e., a signal that will be processed further in accordance with the embodiments). The output of the XOR gate 250 (the intermediate/resulting signal) is mixed with a gain factor $\mu$ by multiplier 260 to produce thereby a second intermediate/resulting signal. The output of multiplier 260 (the second intermediate/resulting signal) is then integrated by integrator 270 to produce thereby a third intermediate/resulting signal. The integrator 270 serves to time-average the result of the multiplier 260. The output of the integrator 270 (the third intermediate/resulting signal) is then multiplied by the in-phase signal I by multiplier 280 to produce thereby a correction factor. The correction factor output from multiplier 280 is then subtracted from the quadrature signal Q by adder 290 to produce a corrected quadrature signal Q' which is output at 240 and which is also the feedback input to XOR gate 250. The I signal is passed through unaltered to output 230 as I'. The circuit embodied in FIG. 2 is advantageous because a filter with a very low cutoff frequency such as 160 in FIG. 1 is expensive to implement and furthermore, the multiplier 150 is replaced by a simple XOR gate 250.

Figure 3:
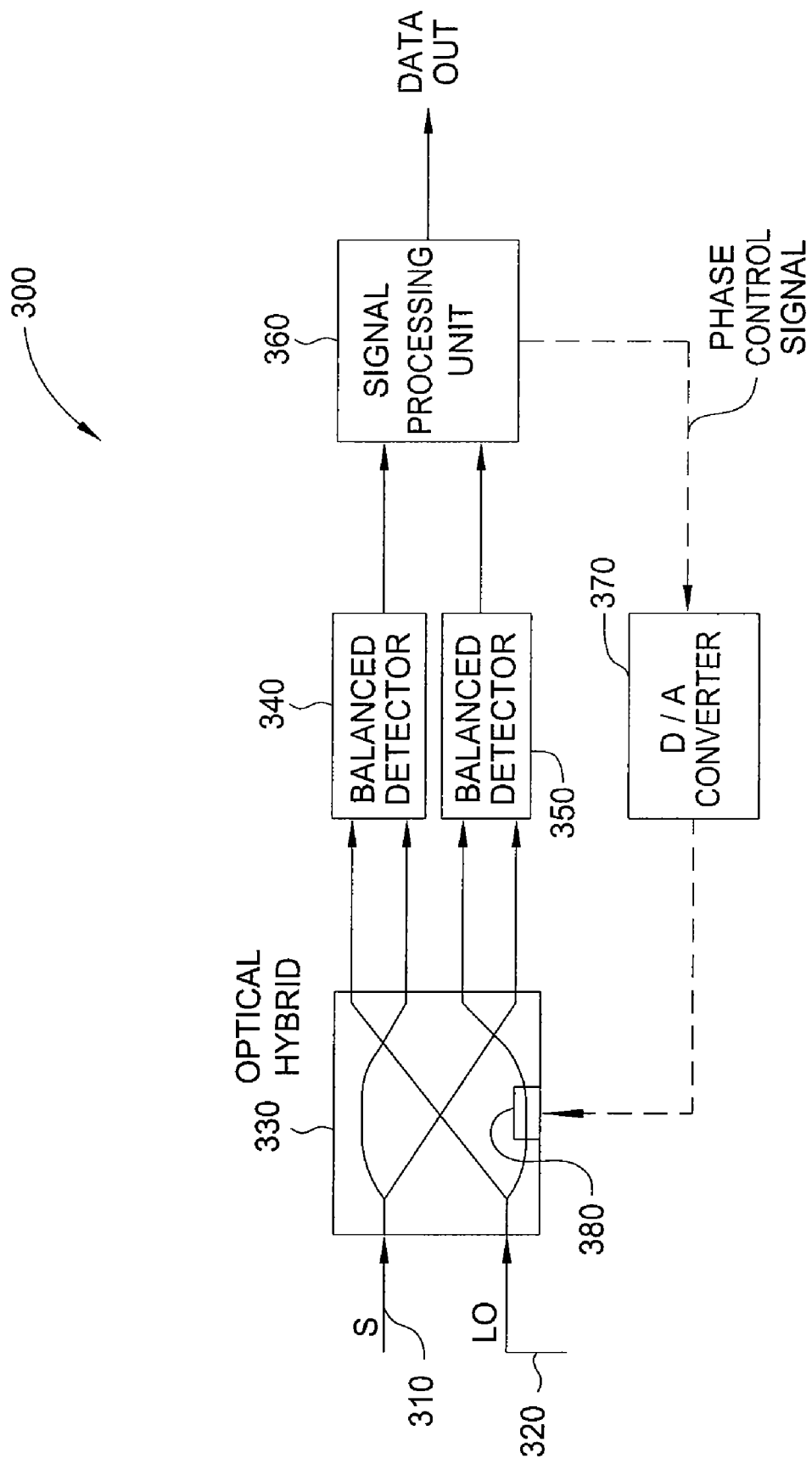
FIG. 3 depicts an optical receiver according to one embodiment of the present invention.

FIG. 3 depicts an optical receiver 300 including a polarization insensitive six-port optical hybrid 330 in accordance with one embodiment of the present invention. Optical hybrids are well known in the art and are described in detail in Patent App. Pub. No. 2007/0297806 A1, Kaneda, et al. which is incorporated by reference herein in its entirety. Optical hybrid 330 is configured to accept as inputs a target signal and a local reference signal. The target signal comprises an in phase component and a quadrature component and may be polarization multiplexed. The target signal may be encoded by one of phase shift keying (PSK), quadrature phase shift keying (QPSK), differential phase shift keying (DPSK), or the like. Detectors 340 and 350 may include balanced detector circuitry which may include photodiodes and the like for converting the received optical signals into electrical signals. The detectors 340 and 350 may include polarization beam splitters in the case where the target input signal is polarization multiplexed. In such case the detectors 340 and 350 may include additional photodiodes and balanced detector circuitry (not shown). In addition, the detectors may include analog to digital converters for sampling and converting received analog signals into corresponding digital signals. In one embodiment, the signal processing unit 360 accepts as inputs digital electrical signals output from the detectors 340 and 350. In one embodiment, the signal processing unit includes phase error correction circuitry as depicted in FIG. 1 or 2.

According to one embodiment of the present invention, the error correction signal of the phase error correction circuitry may be used to drive an adjustable phase control of the optical hybrid 330. This embodiment comprises a hybrid digital-analog loop. As such, this arrangement requires a digital to analog converter 370 as shown in FIG. 3. In this embodiment the phase error correction circuitry may comprise either of the circuits as shown in FIG. 1 or 2. However, in the case where the circuit of FIG. 1 is used, the output of the low pass filter 160 is not multiplied by I and subtracted from Q, but is instead forwarded to the digital to analog converter 370 as a control signal to drive the adjustable phase control 380 of the optical hybrid 330. In the case where the circuit of FIG. 2 is used, the output of multiplier 280 is not multiplied by I and subtracted from Q, but is forwarded to the digital to analog converter 370 as a control signal to drive the adjustable phase control 380 of the optical hybrid 330. In one embodiment the optical hybrid 330 is a planar circuit hybrid. In this implementation adjustable phase control 380 of the optical hybrid 330 is achieved by, for example, thermoelectric heaters for heating one arm of the hybrid or electro-optic effects.

Figure 4:
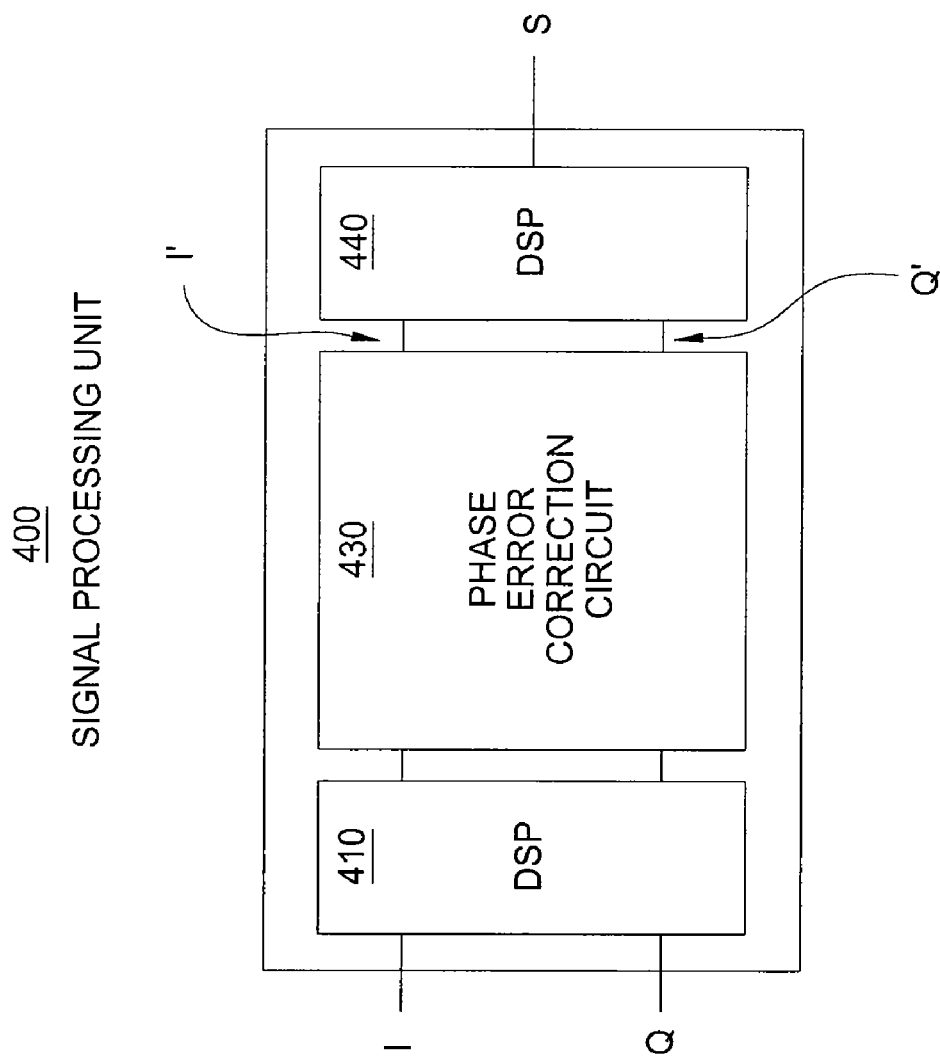
FIG. 4 depicts a signal processing unit according to one embodiment of the present invention.

FIG. 4 depicts a signal processing unit 400, which in one embodiment is signal processing unit 360 in FIG. 3. The signal processing unit 400 includes phase error correction circuitry 430, which in various embodiments is the phase correction circuit as depicted in FIG. 1 or 2. The signal processing unit 400 receives digital in-phase and quadrature signals I and Q. Phase corrected signals I' and Q' are output by the phase error correction circuit 430. The phase corrected signals may be further processed by digital signal processor 440 to extract the original data signal which may be output from the signal processing unit 400 as a recovered signal S. According to various embodiments, the signal processing unit 360 also includes chromatic dispersion correction, frequency offset correction, clock recovery, symbol estimation, and, in the case of a polarization multiplexed optical signal, polarization correction. Such functions are incorporated in DSP blocks 410 or 440 that precede or follow the phase error correction circuit 430.

Figure 5:
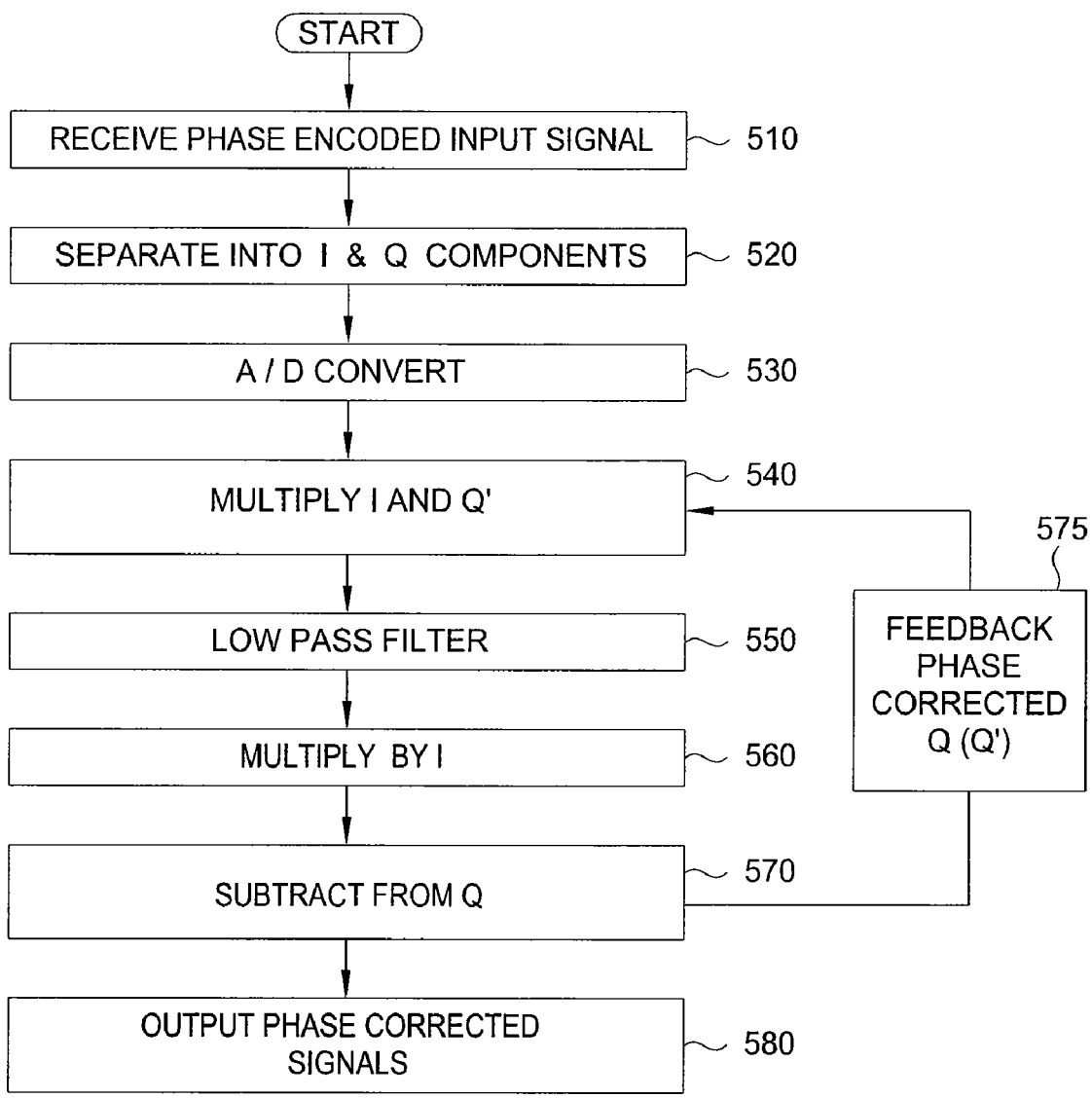
FIG. 5 depicts a flow diagram for a method according to one embodiment of the present invention.

FIG. 5 depicts a flow diagram for a method according to one embodiment of the present invention. The method is performed, for example, in the circuit of FIG. 1. The method begins at step 510 where analog phase encoded input signal is received. At step 520 the received analog phase encoded input signal is separated into in-phase (I) and quadrature phase (Q) components. At step 530 the I and Q components are converted from analog to sampled digital signals. At step 540 the digital I signal is multiplied by the feedback corrected signal Q' from step 575. At step 560 the result of the low pass filtering step 550 is multiplied by the I component. At step 570 the result of step 560 is subtracted from the Q component to produce a corrected Q signal, Q'. At step 580 the phase corrected signals are output.

Figure 6:
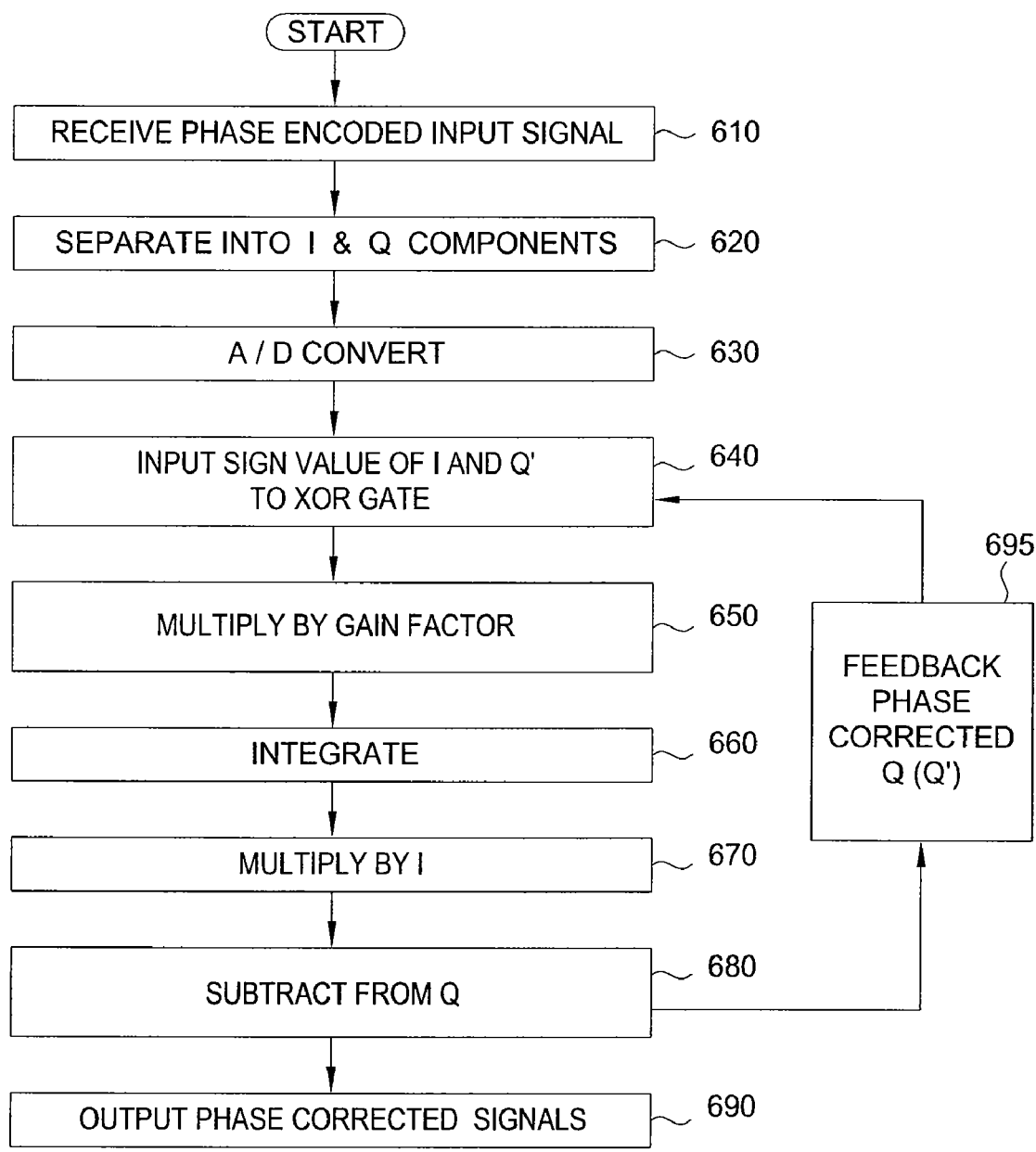
FIG. 6 depicts a flow diagram for a method according to a second embodiment of the present invention.

FIG. 6 depicts a flow diagram for a method according to another embodiment of the present invention. The method is performed, for example, in the circuit of FIG. 2. The method begins at step 610 where analog phase encoded input signal is received. At step 620 the received analog phase encoded input signal is separated into in-phase (I) and quadrature phase (Q) components. At step 630 the I and Q components are converted from analog to sampled digital signals. In this embodiment, the steps 610, 620 and 630 are the same as steps 510, 520 and 530 in FIG. 5. At step 640 an exclusive-or (XOR) operation is performed on only the sign values of I and Q', the feedback corrected signal from step 695. At step 650 the output of the XOR of step 640 is multiplied by a gain factor. At step 660 the result of step 650 is integrated. At step 670 the result of step 660 is multiplied by the I component. At step 680 the result of step 670 is subtracted from the Q component to produce a corrected Q signal, Q'. At step 690, the phase corrected signals are output.

Figure 7:
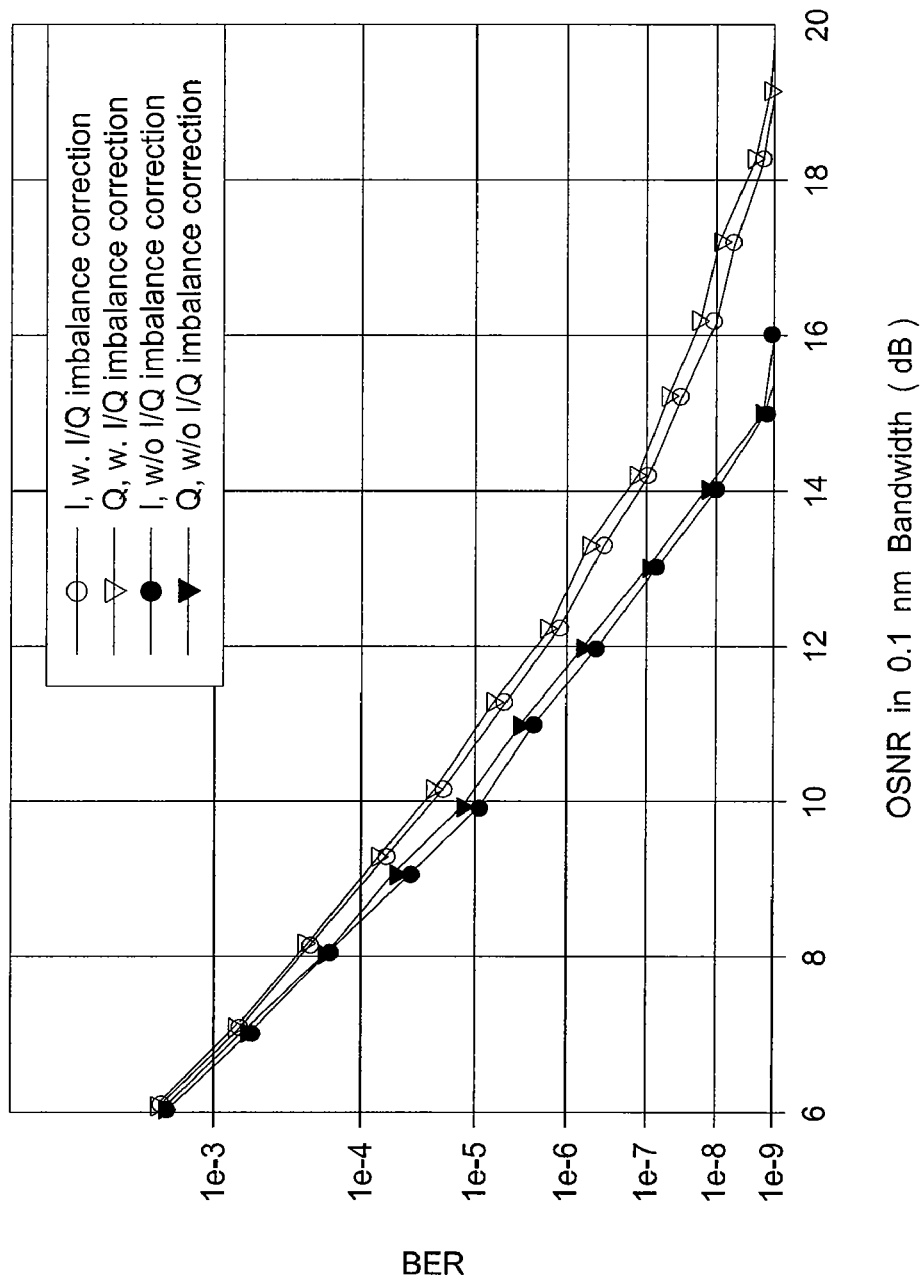
FIG. 7 depicts the measured bit error ratio (BER) versus optical signal-to-noise ratio (OSNR) for a coherent optical receiver in accordance with one embodiment of the present invention.

FIG. 7 depicts the measured bit error ratio (BER) versus optical signal-to-noise ratio (OSNR) for a coherent optical receiver with I/Q correction and without I/Q correction as found by the inventors in an experimental system in accordance with one embodiment of the present invention. Improvement for a system with I/Q correction over a system without I/Q correction assuming a phase error of about 5 degrees is around 0.5 dB for BER=$1e^{-5}$ and greater than 2 dB for BER=$1e^{-9}$.

Figure 8:
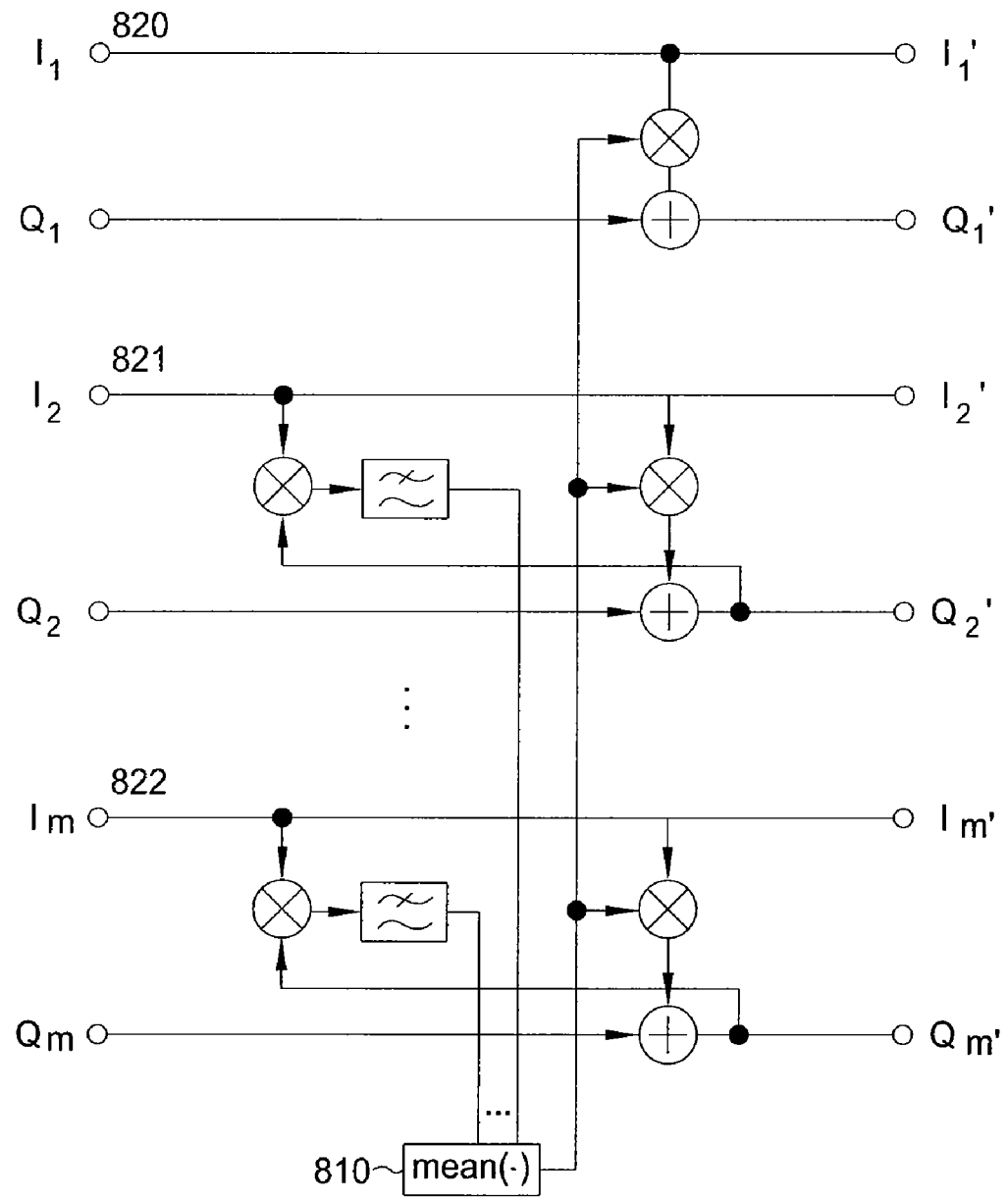
FIG. 8 depicts a parallel processor receiver with multiple data paths in accordance with one embodiment of the present invention.

FIG. 8 depicts a parallel processor receiver with N parallel data paths in accordance with one embodiment. In particular, in an optical coherent receiver, the digital signal processors have a much lower clock rate that the received signals. Therefore, it is advantageous to demultiplex a received signal n-times after digital conversion and process multiple samples in n parallel data paths (where n is between 2 and 1024 or larger, typically between 16 and 128).

In one embodiment, rather than simply repeating the correlator circuits of FIG. 1 or FIG. 2 in each data path, or N times, improved performance can be achieved by combining the correction signal results from multiple correlators (which may comprise the circuit of FIG. 1 or the circuit of FIG. 2), for example, by a mean operation 810 and then supplying n identical mean correction signal results back to a plurality of data paths as shown in FIG. 8. Although the correlators of paths 821 and 822 are depicted as comprising the correlator circuit of FIG. 1, the plurality of correlator circuits implemented in a plurality of the N parallel data paths may also comprise the correlator circuit of FIG. 2.

In one embodiment, a simplified cost effective solution is achieved using a minimum of components. For example, a correlation circuit (such as the circuit of FIG. 1 or FIG. 2) is incorporated in a plurality of less than all data paths. In FIG. 8 for example, path 820 has no correlation circuit whereas paths 821 and 822 are shown with the correlation circuit of FIG. 1. A mean correction signal is only calculated based upon the mean of the correction signals from the plurality of data paths with correlation circuits (e.g., paths 821 and 822) while the mean correction signal output from 810 is supplied to a larger plurality of data paths (paths 820, 821, 822), some of which have no correlation circuit (e.g. path 820) as shown, for example, in FIG. 8. In view of the foregoing, it is readily apparent that different combinations of parallel paths with and without correlation circuits are possible in accordance with various embodiments.

In one embodiment the error signal is not calculated in real time in the signal processor itself. In this embodiment, the signal or portions of the signal are stored in a memory. A second processor can access the stored data and process the data to calculate and correct the phase error with the same processing circuitry or methods as described with respect to the embodiments of FIG. 1, 2, 3, 5, 6 or 8.

An apparatus according to one embodiment for use in an optical receiver comprises a digital signal processor (DSP) implemented in a general purpose computer or a special purpose computer. In various embodiments, such a DSP includes or cooperates with one or more processors, various support circuitry, input-output (I/O) circuitry, memory, communication buses and so on for receiving, processing, providing and/or exchanging information.

The at least one processor may be any conventional processor for executing programs stored in memory. The memory may be any conventional volatile memory (e.g., RAM, DRAM, among others), non-volatile memory (e.g., disk drives, floppy, drives, CDROM, EPROMS, among other computer readable medium) or any other conventional memory device for storing data and various control programs, such as methodology according to the present invention.

The processor cooperates with conventional support circuitry, such as power supplies, clock circuits, cache memory and the like, as well as circuits that assist in executing the various programs and routines, as well as other programs and data. As such, it is contemplated that some of the process steps discussed herein as software processes may be implemented within hardware, for example, as circuitry that cooperates with the processor to perform various steps. The input/output (I/O) circuitry forms an interface between the various functional elements communicating with each network element.

Although the DSP described herein is depicted as a general-purpose computer that is programmed to perform various control functions in accordance with the present embodiments, various embodiments may be implemented in hardware such as, for example, an application specific integrated circuit (ASIC) or a field-programmable gate array (FPGA). As such, it is intended that the processes described herein be broadly interpreted as being equivalently performed by software, hardware, or a combination thereof.

The invention may be implemented as a computer program product wherein computer instructions, when processed by a computer, adapt the operation of the computer such that the methods and/or techniques of the present invention are invoked or otherwise provided. Instructions for invoking the inventive methods may be stored in fixed or removable media, transmitted via a data stream in a signal bearing medium such as a broadcast medium, and/or stored within a working memory within a computing device operating according to the instructions.

Although various embodiments are depicted and described, those skilled in the art will appreciate that other and further embodiments are possible without departing from the teachings herein. For example, the I and Q components of the various embodiments may be readily interchanged while achieving the same functionality. As such, the appropriate scope of the invention is to be determined according to the claims, which follow.

What is claimed is:

1. A method for use in a receiver for detecting and correcting phase error of a phase encoded input signal having in-phase (I) and quadrature-phase (Q) components, comprising:

multiplying a first of the I and Q components of the phase encoded input signal and a corrected second of the I and Q components of the phase encoded input signal to provide thereby a resulting signal;

low-pass filtering the resulting signal to produce thereby a second resulting signal;

multiplying the second resulting signal and the first of the I and Q components of the phase encoded input signal to produce thereby a correction factor; and subtracting the correction factor from the second of the I and Q components of the phase encoded input signal to produce thereby the corrected second of the I and Q components of the phase encoded input signal.

2. The method of claim 1, wherein the corrected second of the I and Q components of the phase encoded input signal is output.

3. The method of claim 2, wherein the first of the I and Q components of the phase encoded input signal is output without correction.

4. The method of claim 1, wherein the first of the I and Q components of the phase encoded input signal is the in-phase component and the second of the I and Q components of the phase encoded input signal is the quadrature-phase component.

5. The method of claim 1, wherein the first of the I and Q components of the phase encoded input signal is the quadrature-phase component and the second of the I and Q components of the phase encoded input signal is the in-phase component.

6. The method of claim 1, wherein:
the first multiplying step further comprises multiplying the instantaneous values of the first of the I and Q components of the phase encoded input signal and the corrected second of the I and Q components of the phase encoded input signal.

7. The method of claim 1, further comprising:
demultiplexing the phase encoded input signal into a plurality of parallel data paths each with I and Q components; and
subtracting the result of the second multiplying step from the second of the I and Q components of one or more of the plurality of parallel data paths.

8. The method of claim 1, further comprising:
demultiplexing the phase encoded input signal into a plurality of parallel data paths each with I and Q components, wherein a plurality of the parallel data paths including means for performing the first multiplying step, the low-pass filtering step, and the second multiplying step;
averaging the results of the second multiplying step from said plurality of parallel data paths to provide an averaged correction factor; and
subtracting the averaged correction factor from the second of the I and Q components of one or more of the plurality of parallel data paths.

9. A method for use in a receiver for detecting and correcting phase error of a phase encoded input signal having in-phase (I) and quadrature-phase (Q) components, comprising:
processing, by an exclusive-or (XOR) operation, the sign value of a first of the I and Q components of the phase encoded input signal and the sign value a corrected second of the I and Q components of the phase encoded input signal to produce thereby a resulting signal;
multiplying the resulting signal by a gain factor to produce thereby a second resulting signal;
integrating the second resulting signal to produce thereby a third resulting signal;

multiplying the first of the I and Q components of the phase encoded input signal by the third resulting signal to produce thereby a correction factor; and subtracting the correction factor from the second of the I and Q components of the phase encoded input signal to produce thereby the corrected second of the I and Q components of the phase encoded input signal.

10. The method of claim 9, wherein the corrected second of the I and Q components of the phase encoded input signal is output.

11. The method of claim 10, wherein the first of the I and Q components of the phase encoded input signal is output without correction.

12. The method of claim 9, wherein the first of the I and Q components of the phase encoded input signal is the in-phase component and the second of the I and Q components of the phase encoded input signal is the quadrature-phase component.

13. The method of claim 9, wherein the first of the I and Q components of the phase encoded input signal is the quadrature-phase component and the second of the I and Q components of the phase encoded input signal is the in-phase component.

14. The method of claim 9, further comprising:
demultiplexing the phase encoded input signal into a plurality of parallel data paths each with I and Q components; and
subtracting the result of the second multiplying step from the second of the I and Q components of one or more of the plurality of parallel data paths.

15. The method of claim 9, further comprising:
demultiplexing the phase encoded input signal into a plurality of parallel data paths each with I and Q components, wherein a plurality of the parallel data paths including means for performing the processing step, the first multiplying step, the integrating step, and the second multiplying step;
averaging the results of the second multiplying step from said plurality of parallel data paths to provide an averaged correction factor; and
subtracting the averaged correction factor from the second of the I and Q components of one or more of the plurality of parallel data paths.

16. An apparatus for detecting and correcting phase error of a phase encoded input signal having in-phase (I) and a quadrature-phase (Q) components, comprising:
a first multiplier for multiplying a first of the I and Q components of the phase encoded input signal and a corrected second of the I and Q components of the phase encoded input signal;
a low-pass filter for filtering the output of the first multiplier;
a second multiplier for multiplying the output of the low-pass filter by the first of the I and Q components of the phase encoded input signal to produce thereby a correction factor; and
an adder, for offsetting the second of the I and Q components of the phase encoded input signal by the correction factor.

17. The apparatus of claim 16, wherein the apparatus comprises an optical receiver.

18. The apparatus of claim 17, wherein the optical receiver is an optical hybrid.

19. An apparatus for detecting and correcting the phase error of a phase encoded input signal having an in-phase (I) component and a quadrature-phase (Q) component, comprising:

an exclusive-or gate with a first of the I and Q components of the phase encoded input signal and a corrected second of the I and Q components of the phase encoded input signal as inputs;

a first multiplier for multiplying the output of the exclusive-or gate by a gain factor;

an integrator for integrating the output of the first multiplier;

a second multiplier for multiplying the output of the integrator by the first of the I and Q components of the phase encoded input signal to produce a correction factor; and an adder, for offsetting the second of the I and Q components of the phase encoded input signal by the correction factor to produce the corrected second of the I and Q components of the phase encoded input signal.

20. The apparatus of claim 19, wherein the apparatus comprises an optical receiver.

21. The apparatus of claim 19, wherein the optical receiver is an optical hybrid.

22. A coherent receiver system comprising:
an optical receiver with an adjustable phase control mechanism;
means for multiplying a first of I and Q components of a phase encoded input signal and a corrected second of the I and Q components of the phase encoded input signal to provide thereby a resulting signal;
means for filtering the resulting signal to produce thereby a second resulting signal;
means for multiplying the second resulting signal and the first of the I and Q components of the phase encoded input signal to produce thereby a correction factor;
means for outputting a digital phase correction signal; and
a digital to analog converter configured to convert the digital phase correction signal to an analog phase correction signal, wherein the analog phase correction signal controls the adjustable phase control mechanism of the optical receiver;
subtracting the correction factor from the second of the I and Q components of the phase encoded input signal to produce thereby the corrected second of the I and Q components of the phase encoded input signal.

23. The coherent receiver system of claim 22, wherein the optical receiver is an optical hybrid.

24. The coherent receiver system of claim 22, wherein the adjustable phase control mechanism comprises at least one thermo-electric heater for heating at least one arm of the optical hybrid.

25. The coherent receiver system of claim 22, wherein the adjustable phase control mechanism is controlled by an electro-optic effect.

* * * * *